United States Patent
Chen (10) Patent No.: US 10,796,862 B1
(45) Date of Patent: Oct. 6, 2020

(54) KEYBOARD

(71) Applicant: Chicony Electronics Co., Ltd., New Taipei (TW)

(72) Inventor: Chih-Hao Chen, New Taipei (TW)

(73) Assignee: Chicony Electronics Co., Ltd., Taipei (TW)

( * ) Notice: Subject to any disclaimer, the term of this patent is extended or adjusted under 35 U.S.C. 154(b) by 0 days.

(21) Appl. No.: 16/520,316

(22) Filed: Jul. 23, 2019

(30) Foreign Application Priority Data

Apr. 11, 2019 (TW) .............................. 108112748 A (51) Int. Cl.
*H01H 13/83* (2006.01)
*H01H 13/70* (2006.01)
*H05K 1/18* (2006.01)
*H05K 1/14* (2006.01)
*H01H 13/79* (2006.01)

(52) U.S. Cl.
CPC ........ *H01H 13/7006* (2013.01); *H01H 13/83* (2013.01); *H05K 1/144* (2013.01); *H05K 1/18* (2013.01); *H01H 13/79* (2013.01); *H01H 2219/06* (2013.01); *H01H 2219/062* (2013.01); *H01H 2221/044* (2013.01); *H05K 2201/09063* (2013.01); *H05K 2201/10606* (2013.01)

(58) Field of Classification Search
CPC .... H01H 13/83; H01H 13/7006; H05K 1/144; H05K 1/18
USPC .................................................. 200/5 A, 310
See application file for complete search history.

(56) References Cited

U.S. PATENT DOCUMENTS

| 6,545,232 B1* | 4/2003 | Huo-Lu | H01H 3/125 200/310 |
| 8,184,021 B2* | 5/2012 | Chou | H01H 13/83 200/310 |
| 8,835,785 B2* | 9/2014 | Yamada | H01H 13/83 200/310 |
| 8,890,014 B1* | 11/2014 | Chen | G02B 6/0036 200/310 |
| 2011/0073454 A1* | 3/2011 | Chen | H01H 13/704 200/5 A |

(Continued)

FOREIGN PATENT DOCUMENTS

| CN | 1928784 A | 3/2007 |
| TW | M536330 U | 2/2017 |

(Continued)

*Primary Examiner* — William A Bolton
*Assistant Examiner* — Iman Malakooti
(74) *Attorney, Agent, or Firm* — CKC & Partners Co., LLC (57) ABSTRACT

A keyboard includes a first substrate, a second substrate, a keyswitch circuit, a connecting member, and a keyswitch assembly. The first substrate has a first through hole. The second substrate is disposed on the first substrate and has a second through hole. The second through hole is connected to the first through hole and located within an inner edge of the first through hole. The keyswitch circuit is disposed on one of the first substrate and the second substrate. The connecting member is engaged with the second through hole and extended onto a bottom surface of the second substrate facing toward the first substrate. The keyswitch assembly is located on a top surface of the second substrate facing away from the first substrate, connected to the connecting member, and configured to trigger the keyswitch circuit.

14 Claims, 6 Drawing Sheets

(56) References Cited

U.S. PATENT DOCUMENTS

2011/0168538 A1* 7/2011 Hwa ................ H01H 13/83
200/5 A
2012/0048702 A1* 3/2012 Liu ................ H01H 3/125
200/5 A

FOREIGN PATENT DOCUMENTS

| TW | M537254 U | 2/2017 |
| TW | 201903804 A | 1/2019 |

* cited by examiner

KEYBOARD

CROSS-REFERENCE TO RELATED APPLICATION

This application claims priority to Taiwan Application Serial Number 108112748, filed Apr. 11, 2019, which is herein incorporated by reference.

BACKGROUND

Technical Field

The present disclosure relates to a keyboard.

Description of Related Art

For a keyswitch on a keyboard, in order to balance the force applied onto the keyswitch by a user, a kind of connection structure is usually disposed under the keycap of the keyswitch, so as to guide the keycap to vertically move.

In general, the foregoing connection structure is often fixed in the keyboard by engaging with hooks formed on a base plate. A conventional method of manufacturing the base plate having the hooks is performing a stamping process to a metal sheet to form the bent and upright hooks. However, when engaging with the foregoing hooks, engaging portions of the connection structure are retained between the hooks and the base plate. Therefore, the machining precision of bending the hooks will have a great impact on the assembly tolerance between the connection structure and the hooks, which will often cause the keyswitch to shake and tilt. Moreover, the aforementioned base plate and connection structure are generally made of metal material, so when the keyboard is used, noises of knocking on metal are often generated.

In addition, a conventional keyboard often uses a membrane circuit board as a switch member of generating key signals. However, the membrane circuit board is easily damaged and difficult to be repaired after frequent use or when be applied with a force improperly. When a trigger circuit in the membrane circuit board corresponding to a certain keyswitch is damaged, it is impossible to repair the trigger circuit for the individual keyswitch, and the whole membrane circuit board of the keyboard must be replaced, so that the maintenance cost is relatively high. Furthermore, the membrane circuit board is made of a soft material and cannot be used as a structural support and a mechanical coupling member. Therefore, the conventional keyboard usually needs to be provided with a hard base plate, which makes the overall structure more complicated and relatively difficult to be assembled.

Accordingly, how to provide a keyboard to solve the aforementioned problems becomes an important issue to be solved by those in the industry.

SUMMARY

An aspect of the disclosure is to provide a keyboard which can effectively solve the aforementioned problems.

According to an embodiment of the disclosure, a keyboard includes a first substrate, a second substrate, a keyswitch circuit, a connecting member, and a keyswitch assembly. The first substrate has a first through hole. The second substrate is disposed on the first substrate and has a second through hole. The second through hole is connected to the first through hole and located within an inner edge of the first through hole. The keyswitch circuit is disposed on one of the first substrate and the second substrate. The connecting member is engaged with the second through hole and extended onto a bottom surface of the second substrate facing toward the first substrate. The keyswitch assembly is located on a top surface of the second substrate facing away from the first substrate, connected to the connecting member, and configured to trigger the keyswitch circuit.

In an embodiment of the disclosure, the second substrate is a printed circuit board.

In an embodiment of the disclosure, the keyswitch circuit is disposed on the top surface of the second substrate.

In an embodiment of the disclosure, the first substrate is a structural reinforcement board.

In an embodiment of the disclosure, the keyboard further includes a light source. The light source is disposed on the top surface of the second substrate and configured to emit light toward the keyswitch assembly.

In an embodiment of the disclosure, the first substrate is a printed circuit board.

In an embodiment of the disclosure, the second substrate further has a hollow hole. The keyswitch circuit is disposed on the first substrate and opposite to the keyswitch assembly via the hollow hole.

In an embodiment of the disclosure, the second substrate further has a hollow hole. The keyboard further includes a light source. The light source is disposed on the first substrate, located in the hollow hole, and configured to emit light toward the keyswitch assembly.

In an embodiment of the disclosure, the second substrate is a light guide plate and has a hollow hole. The keyboard further includes a light source. The light source is disposed on the first substrate, located in the hollow hole, and configured to emit light toward an inner edge of the hollow hole.

In an embodiment of the disclosure, the keyboard further includes a reflective layer disposed between the first substrate and the second substrate.

In an embodiment of the disclosure, the keyboard further includes a shielding layer disposed on the top surface of the second substrate.

In an embodiment of the disclosure, the second through hole is a non-circular hole. The second through hole is embedded with the connecting member.

In an embodiment of the disclosure, the connecting member includes an engaging portion. The engaging portion is located in the first through hole. In a cross-section passing through the first through hole and the second through hole, a width of the engaging portion is smaller than a width of the first through hole and greater than a width of the second through hole.

In an embodiment of the disclosure, the connecting member includes an extending portion, an engaging portion, and a connecting portion. The extending portion is engaged with the second through hole. The engaging portion is extended from the extending portion to the bottom surface of the second substrate. The connecting portion is extended from the extending portion to the top surface of the second substrate and connected to the keyswitch assembly. The second substrate is partially retained between the engaging portion and the connecting portion.

In an embodiment of the disclosure, the first substrate and the second substrate are two printed circuit boards.

Accordingly, the keyboard of the present disclosure adopts a stacked structure of two-layer substrates, in which one of the substrates is a printed circuit board. In the present disclosure, by disposing the keyswitch circuit on the printed circuit board, the keyswitch circuit can be supported by the structures of the two-layer substrates at the same time. Therefore, not only the keyswitch circuit has high product reliability, but also the two-layer substrates can effectively replace the metal substrate that is conventionally used to support a flexible circuit board. The keyboard of the disclosure also uses the connecting member disposed on the two-layer substrates to connect the keyswitch assembly and replace the hooks on a conventional metal base plate. In some embodiments in which the connecting member is made of plastic by injection molding or hot-melting, the assembly tolerance between the connecting member and the keyswitch assembly can be controlled solely by the manufacturing precision of the connecting member itself because the manufacturing precision is significantly higher than that of the stamping process for manufacturing the hooks on the conventional metal base plate, which not only improves the assembly precision of the keyboard of the present disclosure but also avoids noises of knocking on metal during operation. Moreover, the connecting member is fixed to the upper layer in the two-layer substrates, and the lower layer in the two-layer substrates correspondingly has a large-sized hole for accommodating the connecting member. Therefore, it is possible to effectively prevent the connecting member from protruding from the bottom of the two-layer substrates and give the two-layer substrates a flat bottom. Furthermore, through the stacked structure of the two-layer substrates, the problem of bending deformation of the printed circuit board which may be caused by temperature during the injection molding or hot-melting process can be effectively improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing exemplary embodiments, and thus may be embodied in many alternate forms and should not be construed as limited to only exemplary embodiments set forth herein. Therefore, it should be understood that there is no intent to limit exemplary embodiments to the particular forms disclosed, but on the contrary, exemplary embodiments are to cover all modifications, equivalents, and alternatives falling within the scope of the disclosure.

Figure 1:
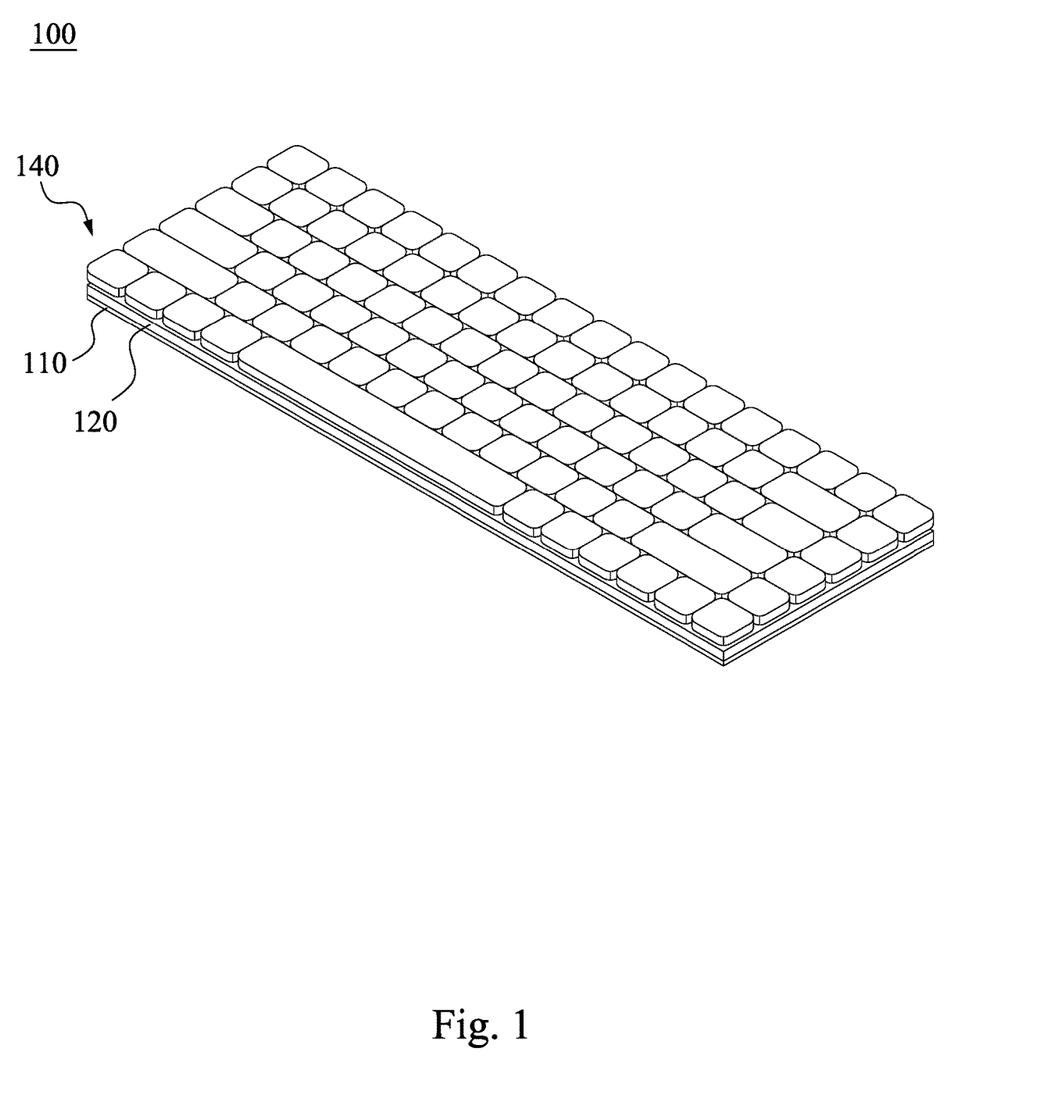
FIG. 1 is a perspective view of a keyboard according to an embodiment of the disclosure.
Figure 2A:
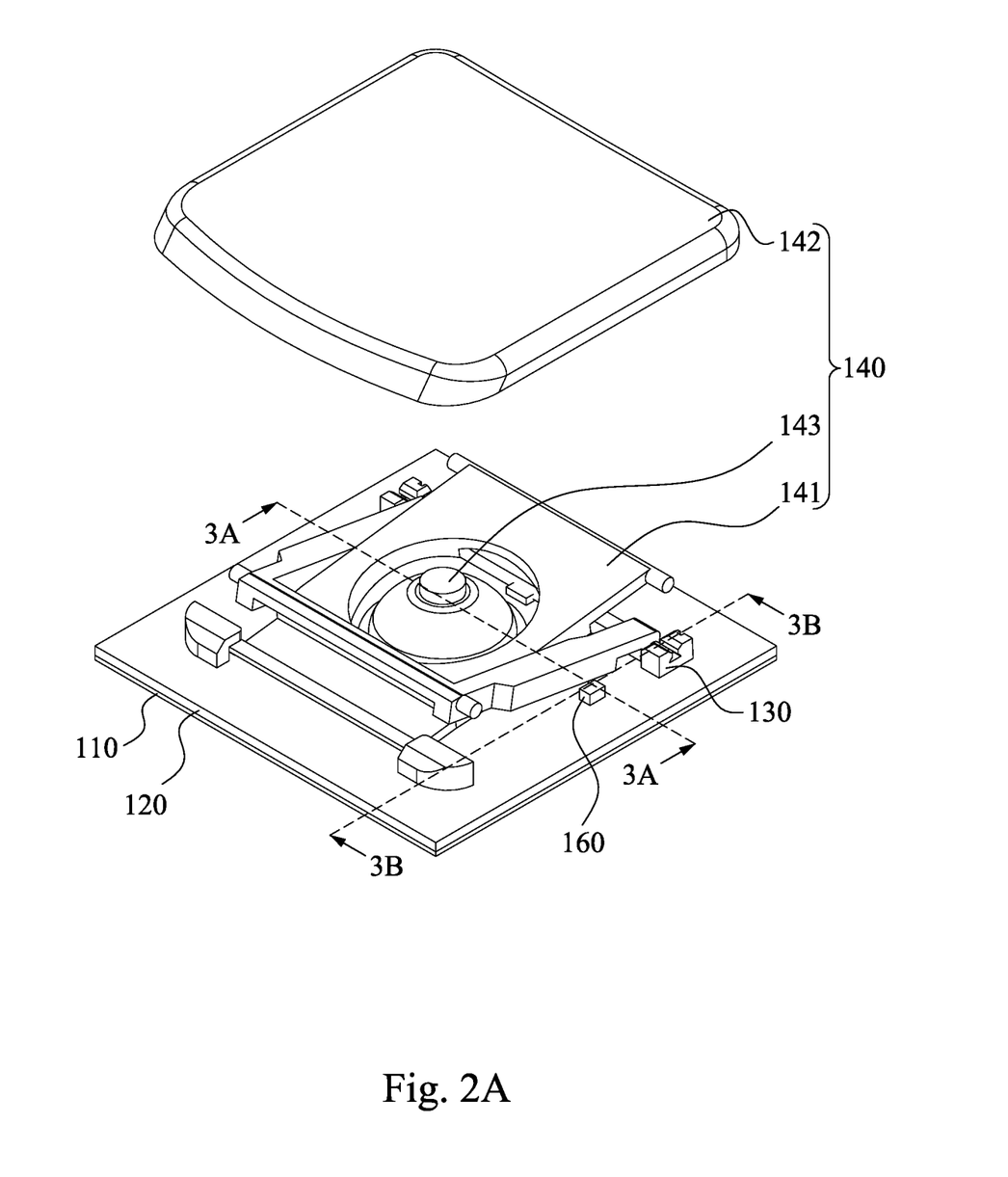
FIG. 2A is a partial perspective view of a keyswitch device according to an embodiment of the disclosure, in which a keycap is separated upward.
Figure 2B:
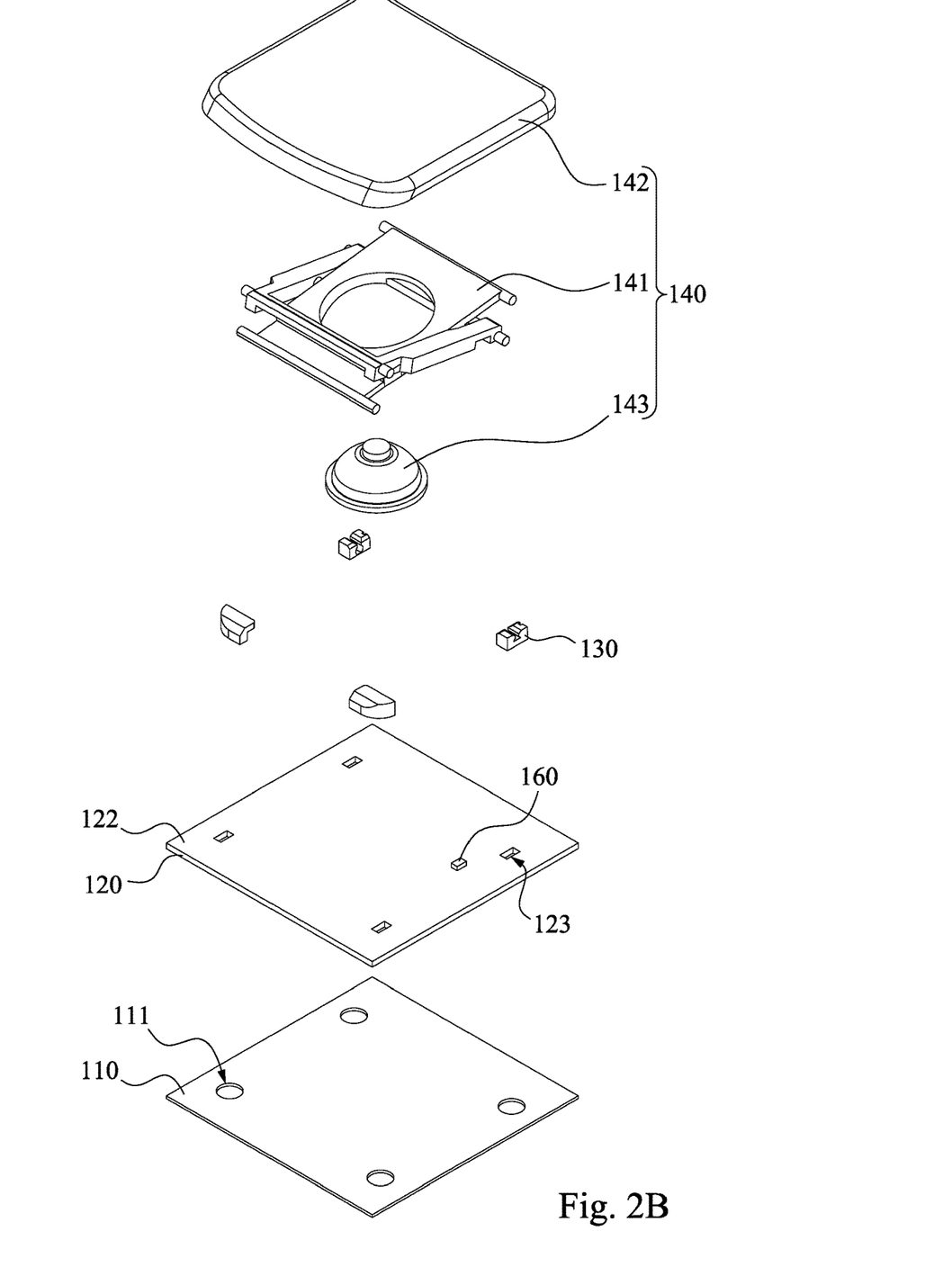
FIG. 2B is an exploded view of the keyswitch device shown in FIG. 2A.

Reference is made to FIGS. 1, 2A, and 1B. FIG. 1 is a perspective view of a keyboard 100 according to an embodiment of the disclosure. FIG. 2A is a partial perspective view of a keyswitch device according to an embodiment of the disclosure, in which a keycap 142 is separated upward. FIG. 2B is an exploded view of the keyswitch device shown in FIG. 2A. As shown in FIGS. 1 to 2B, the keyboard 100 of the disclosure can be an external keyboard (e.g., a keyboard with a PS/2 interface or a keyboard with a USB interface) used in a desktop computer, or can be a part of a computer system having an input device (e.g., a touch pad on a notebook computer) that is in the form of a keyswitch, but the disclosure is not limited in this regard. That is, concepts of the keyboard 100 of the disclosure can be used in any electronic product that performs input function by pressing. In the present embodiment, the keyboard 100 includes a first substrate 110, a second substrate 120, and a plurality of the keyswitch assemblies 140 (only one of which is representatively labeled). Structures and functions of components included in the keyboard 100 and connection and action relationships among these components are introduced in detail below.

As shown in FIGS. 2A and 2B, in the present embodiment, the keyboard 100 further includes a keyswitch circuit 150 (referring to FIG. 3A) and a plurality of connecting members 130 (only one of which is representatively labeled), in which a combination of the first substrate 110, the second substrate 120, the keyswitch circuit 150, four connecting members 130, and one keyswitch assembly 140 can be regarded as a single keyswitch device. The second substrate 120 is disposed on the first substrate 110. The second substrate 120 is a printed circuit board. The first substrate 110 can serve as a structural reinforcement board of the second substrate 120. The keyswitch circuit 150 is disposed on the second substrate 120. In some embodiments, the second substrate 120 adheres to the first substrate 110, but the disclosure is not limited in this regard. In some embodiments, the material of the first substrate 110 includes metal, plastic, or combinations thereof, but the disclosure is not limited in this regard. In some embodiments in which the material of the first substrate 110 includes metal, the metal may be stainless steel (SUS) or hot dip galvanized steel (KU400), which has the advantages of high-temperature resistance, high strength, and good heat dissipation effect.

In the present embodiment, the connecting member 130 is disposed on the second substrate 120. Specifically, the material of the connecting member 130 includes plastic and can be manufactured by injection molding or hot-melting processes.

In the present embodiment, the keyswitch assembly 140 is disposed on the second substrate 120 and includes a guiding structure 141, a keycap 142, and a position-returning member 143. The keycap 142 is located over the second substrate 120. The guiding structure 141 is engaged between the connecting member 130 and the keycap 142 and is consisted of two linkages that are pivotally connected to each other, so as to guide the keycap 142 to move toward or away from the second substrate 120. The position-returning member 143 is disposed on the second substrate 120, located between the second substrate 120 and the keycap 142, and located over the keyswitch circuit 150. When the keycap 142 is pressed downwards by an external force, the position-returning member 143 generates a counterforce to the keycap 142 so as to provide users the feeling of pressing. When the external force applied onto the keycap 142 is released, the position-returning member 143 can provide a restoring force for returning the keycap 142 back to its original position at which the keycap 142 is not pressed. In some embodiments, the position-returning member 143 may be a resilient member, such as a rubber dome, a metal dome, or an elastic plate.

In practical applications, the guiding structure 141 can be replaced by other structures having similar functions (i.e., guiding the keycap 142 to move up and down relative to the substrates), such as a V-shaped linkage structure, an A-shaped linkage structure, or a linkage structure having two parallel linkages. The position-returning member 143 can also be replaced by other component having similar functions, such as a magnetic component.

Figure 3A:
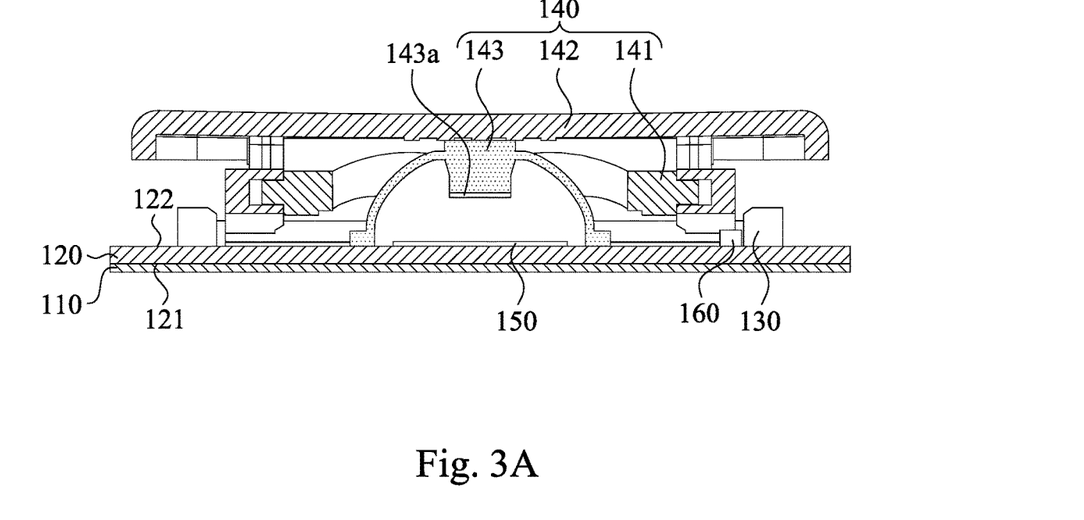
FIG. 3A is a cross-sectional view of the keyswitch device shown in FIG. 2A taken along line 3A-3A after being assembled.
Figure 4:
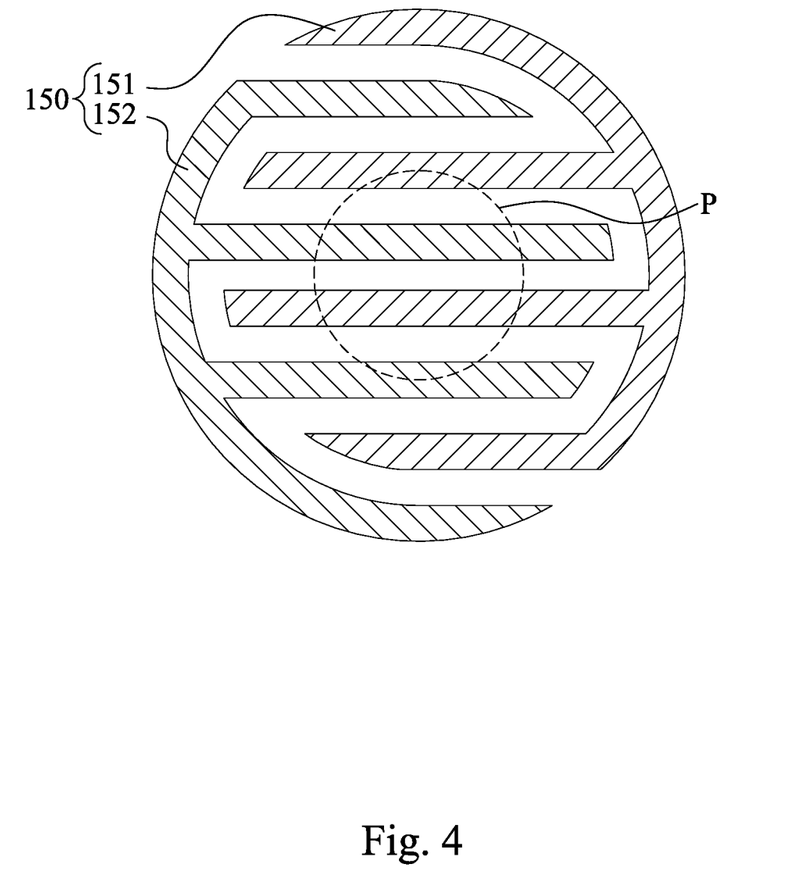
FIG. 4 is a partial top view of a keyswitch circuit according to an embodiment of the disclosure.

Reference is made to FIGS. 3A and 4. FIG. 3A is a cross-sectional view of the keyswitch device shown in FIG. 2A taken along line 3A-3A after being assembled. FIG. 4 is a partial top view of a keyswitch circuit 150 according to an embodiment of the disclosure. As shown in FIGS. 3A and 4, in the present embodiment, the keyswitch circuit 150 is disposed on a top surface 122 of the second substrate 120 and includes a first switch pad 151 and a second switch pad 152. The second switch pad 152 is separated from the first switch pad 151, and they have a plurality of extending branches that are interdigitated with each other. As shown in FIG. 3A, the position-returning member 143 is substantially cup-shaped and has a trigger portion 143a therein. The trigger portion 143a includes a conductive material. When the keycap 142 is pressed downward by an external force, the position-returning member 143 is compressed by the keycap 142 and deformed synchronously, such that the trigger portion 143a moves downward to contact the first switch pad 151 and the second switch pad 152. A vertical projection P of the trigger portion 143a (depicted with a dotted line in FIG. 4) projected onto the top surface 122 of the second substrate 120 at least partially overlaps the first switch pad 151 and the second switch pad 152.

With the foregoing structural configurations, it can be seen that the keyboard 100 of the present embodiment adopts a stacked structure of two-layer substrates, in which the second substrate 120 is a printed circuit board. By disposing the keyswitch circuit 150 on the second substrate 120, the keyswitch circuit 150 can be supported by the structures of the two-layer substrates at the same time. Therefore, not only the keyswitch circuit 150 has high product reliability, but also the two-layer substrates can effectively replace the metal substrate that is conventionally used to support a flexible circuit board. Moreover, the keyboard 100 of the present embodiment also uses the connecting member 130 disposed on the second substrate 120 to connect the keyswitch assembly 140 and replace the hooks on a conventional metal base plate. Since the connecting member 130 includes plastic and can be manufactured by injection molding or hot-melting, the manufacturing precision is significantly higher than that of the stamping process for manufacturing the hooks on the conventional metal base plate. Therefore, the assembly tolerance between the connecting member 130 and the keyswitch assembly 140 can be controlled solely by the manufacturing precision of the connecting member 130 itself, which not only improves the assembly precision of the keyboard 100 of the present embodiment, but also avoids noises of knocking on metal during operation.

Figure 3B:
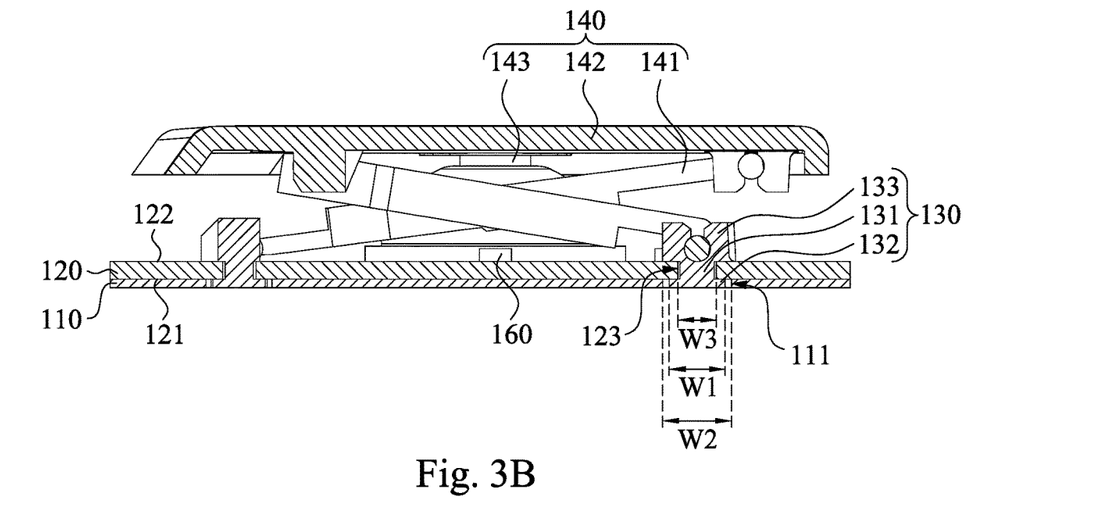
FIG. 3B is a cross-sectional view of the keyswitch device shown in FIG. 2A taken along line 3B-3B after being assembled.

Reference is made to FIG. 3B. FIG. 3B is a cross-sectional view of the keyswitch device shown in FIG. 2A taken along line 3B-3B after being assembled. As shown in FIG. 3B, in the present embodiment, the first substrate 110 has a first through hole 111. The second substrate 120 has a second through hole 123. The second through hole 123 is connected to the first through hole 111 and located within an inner edge of the first through hole 111. The connecting member 130 is engaged with the second through hole 123 and extended onto a bottom surface 121 of the second substrate 120 facing toward the first substrate 110. Specifically, the connecting member 130 includes an extending portion 131 and an engaging portion 132. The extending portion 131 is engaged with the second through hole 123. As shown in FIG. 2B, the second through hole 123 is a non-circular hole. The second through hole 123 is embedded with the extending portion 131 of the connecting member 130, so as to prevent the connecting member 130 from rotating relative to the second substrate 120. In practical applications, the second through hole 123 can also be modified into other polygons of specific shapes. The engaging portion 132 is extended from the extending portion 131 to the bottom surface 121 of the second substrate 120. In a cross-section passing through the first through hole 111 and the second through hole 123 (i.e., the cross section shown in FIG. 3B), a width W1 of the engaging portion 132 is smaller than a width W2 of the first through hole 111 and greater than a width W3 of the second through hole 123. With the structural configurations, it can be seen that the connecting member 130 is fixed on the second through hole 123 of the second substrate 120, and the first substrate 110 correspondingly has a large-sized hole (i.e., the first through hole 111) for accommodating the connecting member 130, so as to effectively prevent the connecting member 130 from protruding from the bottom of the first substrate 110 and give the first substrate 110 a flat bottom.

In addition, as shown in FIG. 3B, in the present embodiment, the connecting member 130 further includes a connecting portion 133. The connecting portion 133 is extended from the extending portion 131 to the top surface 122 of the second substrate 120 and connected to the keyswitch assembly 140. The second substrate 120 is partially retained between the engaging portion 132 and the connecting portion 133. With the structural configurations, the connecting member 130 can be more firmly fixed to the second substrate 120 without being easily detached.

In addition, as shown in FIGS. 2A to 3B, in the present embodiment, the keyboard 100 further includes a light source 160. The light source 160 is disposed on the top surface 122 of the second substrate 120 and configured to emit light toward the keyswitch assembly 140 (i.e., emit light upward). Hence, the keyswitch circuit 150 and the light source 160 in the present embodiment can be disposed on the second substrate 120, but the disclosure is not limited in this regard.

Figure 5:
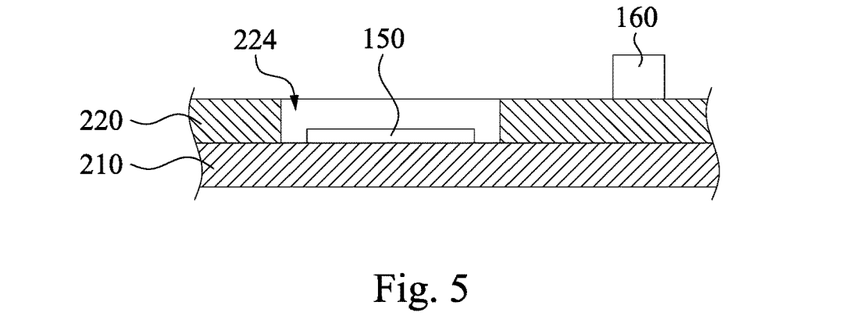
FIG. 5 is a schematic cross-sectional view of some components of a keyswitch device according to another embodiment of the disclosure.

Reference is made to FIG. 5. FIG. 5 is a schematic cross-sectional view of some components of a keyswitch device according to another embodiment of the disclosure. The keyswitch device of the present embodiment includes a keyswitch circuit 150, a connecting member 130, a keyswitch assembly 140, and a light source 160 which are identical to those as shown in FIG. 2B, so the description of these components may be referred to the relevant paragraphs above and will not be repeated here, and the connecting member 130 and the keyswitch assembly 140 are omitted and not depicted. Compared to the keyswitch device as shown in FIG. 2B, the keyswitch device of the present embodiment provides an alternative first substrate 210 and an alternative second substrate 220. Specifically, the first substrate 210 and the second substrate 220 in the present embodiment are printed circuit boards, in which the keyswitch circuit 150 is disposed on the first substrate 210 and the light source 160 is disposed on the second substrate 220. The first substrate 210 and the second substrate 220 respectively have identical or similar first and second through holes 111, 123 as shown in FIG. 3B, and the second substrate 220 further has a hollow hole 224 to expose the keyswitch circuit 150 disposed on the first substrate 210 (i.e., the keyswitch circuit 150 is opposite to the keyswitch assembly 140 via the hollow hole 224), so as to allow the trigger portion 143a to move downward to trigger the keyswitch circuit 150 via the hollow hole 224.

Figure 6:
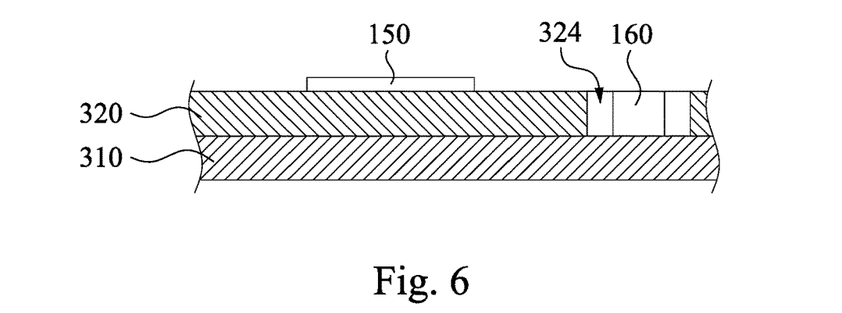
FIG. 6 is a schematic cross-sectional view of some components of a keyswitch device according to another embodiment of the disclosure.

Reference is made to FIG. 6. FIG. 6 is a schematic cross-sectional view of some components of a keyswitch device according to another embodiment of the disclosure. The keyswitch device of the present embodiment includes a keyswitch circuit 150, a connecting member 130, a keyswitch assembly 140, and a light source 160 which are identical to those as shown in FIG. 2B, so the description of these components may be referred to the relevant paragraphs above and will not be repeated here, and the connecting member 130 and the keyswitch assembly 140 are omitted and not depicted. Compared to the keyswitch device as shown in FIG. 2B, the keyswitch device of the present embodiment provides an alternative first substrate 310 and an alternative second substrate 320. Specifically, the first substrate 310 and the second substrate 320 in the present embodiment are printed circuit boards, in which the keyswitch circuit 150 is disposed on the second substrate 320 and the light source 160 is disposed on the first substrate 310. The first substrate 310 and the second substrate 320 respectively have identical or similar first and second through holes 111, 123 as shown in FIG. 3B, and the second substrate 320 further has a hollow hole 324 to expose the light source 160 disposed on the first substrate 310 (i.e., the light source 160 is located in the hollow hole 324), so as to allow the light emitted by the light source 160 to reach the keyswitch assembly 140 over the second substrate 320 via the hollow hole 324. Moreover, since the light source 160 is accommodated in the hollow hole 324 of the second substrate 320 without protruding out from a surface of the second substrate 320 away from the first substrate 310, structural interference between the light source 160 and the keyswitch assembly 140 above can be avoided, and the flexibility of adjusting the position of the light source 160 can be increased.

Figure 7:
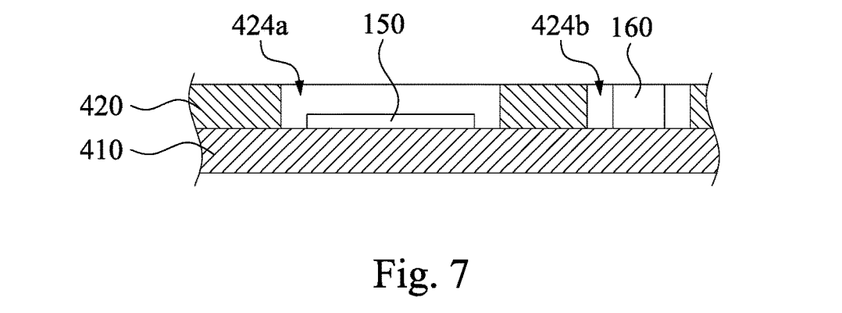
FIG. 7 is a schematic cross-sectional view of some components of a keyswitch device according to another embodiment of the disclosure.

Reference is made to FIG. 7. FIG. 7 is a schematic cross-sectional view of some components of a keyswitch device according to another embodiment of the disclosure. The keyswitch device of the present embodiment includes a keyswitch circuit 150, a connecting member 130, a keyswitch assembly 140, and a light source 160 which are identical to those as shown in FIG. 2B, so the description of these components may be referred to the relevant paragraphs above and will not be repeated here, and the connecting member 130 and the keyswitch assembly 140 are omitted and not depicted. Compared to the keyswitch device as shown in FIG. 2B, the keyswitch device of the present embodiment provides an alternative first substrate 410 and an alternative second substrate 420. Specifically, the first substrate 410 in the present embodiment is a printed circuit board, and the second substrate 420 is a structural reinforcement board, in which the keyswitch circuit 150 and the light source 160 are disposed on the first substrate 410. The first substrate 410 and the second substrate 420 respectively have identical or similar first and second through holes 111, 123 as shown in FIG. 3B, and the second substrate 420 further has hollow holes 424a, 424b. The hollow hole 424a is configured to expose the keyswitch circuit 150 disposed on the first substrate 410 (i.e., the keyswitch circuit 150 is opposite to the keyswitch assembly 140 via the hollow hole 424a), so as to allow the trigger portion 143a to move downward to trigger the keyswitch circuit 150 via the hollow hole 224. The hollow hole 424b is configured to expose the light source 160 disposed on the first substrate 410 (i.e., the light source 160 is located in the hollow hole 424b), so as to allow the light emitted by the light source 160 to reach the keyswitch assembly 140 over the second substrate 420 via the hollow hole 324.

Figure 8:
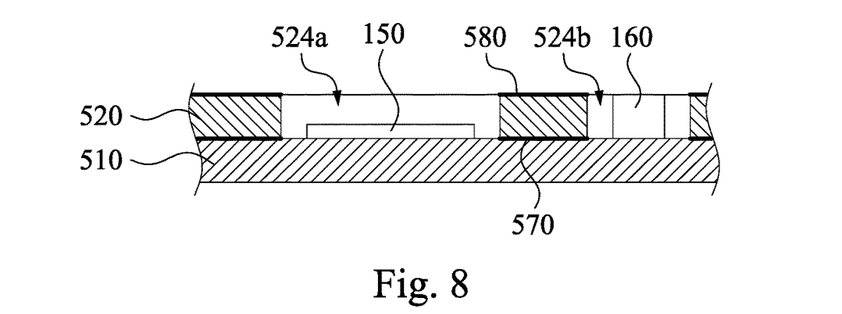
FIG. 8 is a schematic cross-sectional view of some components of a keyswitch device according to another embodiment of the disclosure.

Reference is made to FIG. 8. FIG. 8 is a schematic cross-sectional view of some components of a keyswitch device according to another embodiment of the disclosure. The keyswitch device of the present embodiment includes a keyswitch circuit 150, a connecting member 130, a keyswitch assembly 140, and a light source 160 which are identical to those as shown in FIG. 2B, so the description of these components may be referred to the relevant paragraphs above and will not be repeated here, and the connecting member 130 and the keyswitch assembly 140 are omitted and not depicted. Compared to the keyswitch device as shown in FIG. 2B, the keyswitch device of the present embodiment provides an alternative first substrate 510 and an alternative second substrate 520. Specifically, the first substrate 510 in the present embodiment is a printed circuit board and the second substrate 520 is a light guide plate, in which the keyswitch circuit 150 and the light source 160 are disposed on the first substrate 510. In some embodiments, the material of the second substrate 520 includes polycarbonate (PC), but the disclosure is not limited in this regard. The first substrate 510 and the second substrate 520 respectively have identical or similar first and second through holes 111, 123 as shown in FIG. 3B, and the second substrate 520 further has hollow holes 524a, 524b. The hollow hole 524a is configured to expose the keyswitch circuit 150 disposed on the first substrate 510 (i.e., the keyswitch circuit 150 is opposite to the keyswitch assembly 140 via the hollow hole 524a), so as to allow the trigger portion 143a to move downward to trigger the keyswitch circuit 150 via the hollow hole 524a. The hollow hole 524b is configured to expose the light source 160 disposed on the first substrate 510 (i.e., the light source 160 is located in the hollow hole 524b), so as to allow the light source 160 to emit light toward an inner edge of the hollow hole 524b (i.e., emit light laterally) and make the light enter the second substrate 520. The second substrate 520 is configured to uniformly guide the light propagating therein and to cause the light to exit from the surface away from the first substrate 510 to reach the keyswitch assembly 140 above. Compared to foregoing embodiments, since the second substrate 520 of the keyswitch device of the present embodiment adopts a light guide plate, the same light source 160 can be shared by a plurality of keyswitch devices, and the component cost can be reduced.

In some embodiments, as shown in FIG. 8, in order to increase the light-emitting effect of the second substrate 520, a reflective layer 570 may be further disposed between the first substrate 510 and the second substrate 520 such that light propagating in the second substrate 520 is reflected by the reflective layer 570 and leaves the surface of the second substrate 520 away from the first substrate 510, and the problem of light loss absorbed by the first substrate 510 can be effectively solved.

In some embodiments, as shown in FIG. 8, a shielding layer 580 may be further disposed on the top surface of the second substrate 520 (i.e., the surface of the second substrate 520 away from the first substrate 510), so that light can leave from a predetermined area of the top surface of the second substrate 520 on which the shielding layer 580 does not cover and then reach the keyswitch assembly 140 above, thereby using the light emitted by the light source 160 more efficiently.

According to the foregoing recitations of the embodiments of the disclosure, it can be seen that the keyboard of the present disclosure adopts a stacked structure of two-layer substrates, in which one of the substrates is a printed circuit board. In the present disclosure, by disposing the keyswitch circuit on the printed circuit board, the keyswitch circuit can be supported by the structures of the two-layer substrates at the same time. Therefore, not only the keyswitch circuit has high product reliability, but also the two-layer substrates can effectively replace the metal substrate that is conventionally used to support a flexible circuit board. The keyboard of the disclosure also uses the connecting member disposed on the two-layer substrates to connect the keyswitch assembly and replace the hooks on a conventional metal base plate. In some embodiments in which the connecting member is made of plastic by injection molding or hot-melting, the assembly tolerance between the connecting member and the keyswitch assembly can be controlled solely by the manufacturing precision of the connecting member itself because the manufacturing precision is significantly higher than that of the stamping process for manufacturing the hooks on the conventional metal base plate, which not only improves the assembly precision of the keyboard of the present disclosure, but also avoids noises of knocking on metal during operation. Moreover, the connecting member is fixed to the upper layer in the two-layer substrates, and the lower layer in the two-layer substrates correspondingly has a large-sized hole for accommodating the connecting member. Therefore, it is possible to effectively prevent the connecting member from protruding from the bottom of the two-layer substrates and give the two-layer substrates a flat bottom. Furthermore, through the stacked structure of the two-layer substrates, the problem of bending deformation of the printed circuit board which may be caused by temperature during the injection molding or hot-melting process can be effectively improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A keyboard, comprising:
   a first substrate having a first through hole;
   a second substrate disposed on the first substrate and having a second through hole, wherein the second through hole is connected to the first through hole and located within an inner edge of the first through hole;
   a keyswitch circuit disposed on one of the first substrate and the second substrate;
   a connecting member engaged with the second through hole and extended onto a bottom surface of the second substrate facing toward the first substrate; and
   a keyswitch assembly located on a top surface of the second substrate facing away from the first substrate, connected to the connecting member, and configured to trigger the keyswitch circuit,
   wherein the connecting member comprises an engaging portion, the engaging portion is located in the first through hole, and in a cross section passing through the first through hole and the second through hole, a width of the engaging portion is smaller than a width of the first through hole and greater than a width of the second through hole.

2. The keyboard of claim 1, wherein the second substrate is a printed circuit board.

3. The keyboard of claim 2, wherein the keyswitch circuit is disposed on the top surface of the second substrate.

4. The keyboard of claim 2, wherein the first substrate is a structural reinforcement board.

5. The keyboard of claim 2, further comprising a light source disposed on the top surface of the second substrate and configured to emit light toward the keyswitch assembly.

6. The keyboard of claim 1, wherein the first substrate is a printed circuit board.

7. The keyboard of claim 6, wherein the second substrate further has a hollow hole, and the keyswitch circuit is disposed on the first substrate and opposite to the keyswitch assembly via the hollow hole.

8. The keyboard of claim 6, wherein the second substrate further has a hollow hole, the keyboard further comprises a light source, and the light source is disposed on the first substrate, located in the hollow hole, and configured to emit light toward the keyswitch assembly.

9. The keyboard of claim 6, wherein the second substrate is a light guide plate and has a hollow hole, the keyboard further comprises a light source, and the light source is disposed on the first substrate, located in the hollow hole, and configured to emit light toward an inner edge of the hollow hole.

10. The keyboard of claim 9, further comprising a reflective layer disposed between the first substrate and the second substrate.

11. The keyboard of claim 9, further comprising a shielding layer disposed on the top surface of the second substrate.

12. The keyboard of claim 1, wherein the second through hole is a non-circular hole, and the second through hole is embedded with the connecting member.

13. The keyboard of claim 1, wherein the first substrate and the second substrate are two printed circuit boards.

14. A keyboard, comprising:
    a first substrate having a first through hole;

a second substrate disposed on the first substrate and having a second through hole, wherein the second through hole is connected to the first through hole and located within an inner edge of the first through hole;

a keyswitch circuit disposed on one of the first substrate and the second substrate;

a connecting member engaged with the second through hole and extended onto a bottom surface of the second substrate facing toward the first substrate; and a keyswitch assembly located on a top surface of the second substrate facing away from the first substrate, connected to the connecting member, and configured to trigger the keyswitch circuit, wherein the connecting member comprises:
- an extending portion engaged with the second through hole;
- an engaging portion extended from the extending portion to the bottom surface of the second substrate; and
- a connecting portion extended from the extending portion to the top surface of the second substrate and connected to the keyswitch assembly, wherein the second substrate is partially retained between the engaging portion and the connecting portion.

* * * * *